United States Patent [19]

Currie

[11] 3,914,712

[45] Oct. 21, 1975

[54] VOLTAGE CONTROLLED OSCILLATOR HAVING FREQUENCY VARYING INVERSELY WITH CONTROL VOLTAGE

[75] Inventor: James R. Currie, Huntsville, Ala.

[73] Assignee: The United States of America as represented by the United States National Aeronautics and Space Administration Office of General Counsel - Code GP, Washington, D.C.

[22] Filed: Sept. 30, 1974

[21] Appl. No.: 510,679

[52] U.S. Cl. ............ 331/111; 331/108 D; 331/135; 331/143; 331/177 R

[51] Int. Cl.[2] ........................ H03K 1/16; H03K 3/02

[58] Field of Search ....... 331/108 D, 111, 143, 135, 331/177 R

[56] References Cited

UNITED STATES PATENTS

| | | | |
|---|---|---|---|
| 3,656,066 | 4/1972 | Reynal | 331/111 X |
| 3,760,248 | 9/1973 | Nola et al. | 331/135 X |

*Primary Examiner*—Siegfried H. Grimm
*Attorney, Agent, or Firm*—George J. Porter; L. D. Wofford, Jr.; John R. Manning

[57] ABSTRACT

A voltage controlled oscillator wherein the frequency of the oscillator varies linearly with the reciprocal of the input voltage. It employs two cascaded operational amplifiers wherein the first one functions as a comparator and the second one functions as an integrator, the output of the latter being coupled back to a non-inverting input of the former.

4 Claims, 3 Drawing Figures

VOLTAGE CONTROLLED OSCILLATOR HAVING FREQUENCY VARYING INVERSELY WITH CONTROL VOLTAGE

ORIGIN OF THE INVENTION

The invention described herein was made by an employee of the United States Government and may be manufactured and used by or for the Government of the United States of America for governmental purposes without the payment of any royalties thereon or therefor.

BACKGROUND OF THE INVENTION

1. Field of the Invention

This invention relates to voltage controlled oscillators, and particularly to a voltage controlled oscillator wherein the frequency of the output varies inversely with the input control voltage.

2. General Description of the Prior Art

While there are many known oscillators which provide an output frequency which varies directly as some function of an input control voltage, the applicant is unaware of any previous voltage controlled oscillator which provides an output which varies the frequency directly with the reciprocal of the input control voltage. There is an obvious demand for such a device, one being for conversion of analog signals to inverse digital signals.

OBJECT OF THE INVENTION

It is the object of this invention to provide a voltage controlled oscillator with a new dimension of operation, that of providing an output frequency which varies directly with the reciprocal of an input control voltage.

SUMMARY OF THE INVENTION

In accordance with this invention, two operational amplifiers are connected in cascade with the output of the second amplifier being connected to the non-inverting input of the first amplifier. The first amplifier operates as an open loop comparator, having a transistor switch connected across the inverting input which is driven by an output of this operational amplifier. The circuit input, that is, the control voltage, is also applied to the inverting input of the first amplifier. The second amplifier is connected as an integrator, and its output is coupled to the non-inverting input of the first operational amplifier.

DETAILED DESCRIPTION OF THE DRAWINGS

Figure 1:
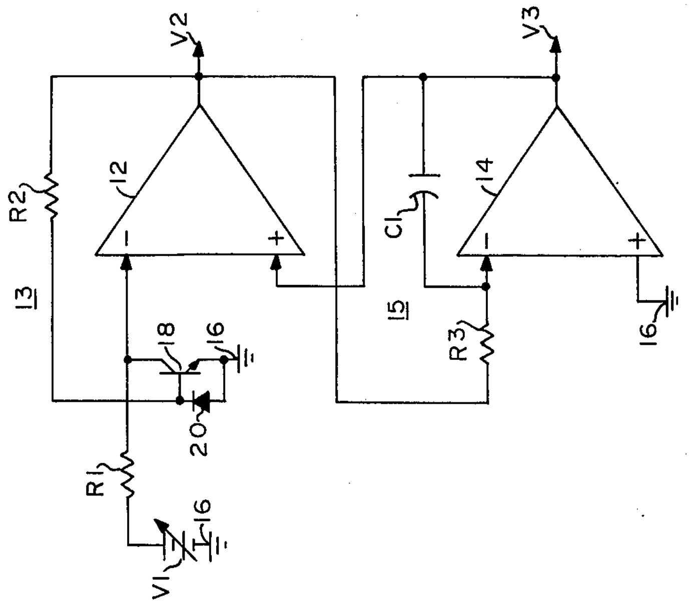
FIG. 1 is an electrical schematic diagram of an embodiment of the invention.

With reference to FIG. 1, there is shown a schematic diagram of a voltage controlled oscillator, or V.C.O. It employs cascaded operational amplifiers 12 and 14. The output V2 of amplifier 12 of comparator 13 is connected through resistor R3 to the inverting input of operational amplifier 14, whereas the output of amplifier 14 is connected as an "in phase" or positive feedback signal to the plus, or non-inverting, input of amplifier 12. The plus, or non-inverting input of amplifier 14 is in turn connected to common ground 16, and the inverting input of amplifier 12 is connected through resistor R1 to the positive output of control voltage source V1. The negative, or inverting input of amplifier 12 is further connected to the collector of clamping transistor 18, the emitter of which is connected to common ground 16. The base of this transistor is coupled through resistor R2 to the output of amplifier 12 and to the cathode of protector diode 20, the anode of which is also connected to common ground 16.

Amplifier 14 is employed in integrating circuit 15 wherein capacitor C is connected between the output and the inverting input of this amplifier. Amplifier 12 is connected to operate as an open loop comparator circuit which compares input voltage V1 with output V3 of integrator 15.

Figure 2:
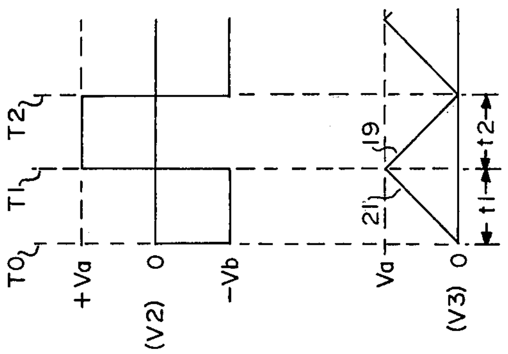

Referring to FIG. 2, assume that at time T0, a positive control voltage V1 of a selected value, is applied through R1 to the inverting input of amplifier 12. This causes the output voltage V2 to switch to a full negative voltage level $-Vb$ since at time T0 the output V3 of amplifier 14 is at zero voltage level. The full negative output voltage $-Vb$ is then applied through resistor R3 to the inverting input of amplifier 14. Voltage V3 at the output of amplifier 14 then begins to integrate upward in response to a negative input at the inverting input of amplifier 14. This voltage is applied to the non-inverting, or positive input of amplifier 12.

At time T1, output voltage V3 at the output of amplifier 14 exceeds the input voltage V1 applied to the inverting input of amplifier 12, and thus the inverting input becomes very slightly negative with respect to the voltage applied to the non-inverting input. This causes the output V2 of amplifier 12 to change state to a positive voltage $Va$. Current through resistor R2 is now applied to the base of transistor 18, which drives transistor 18 into saturation and effectively grounds the inverting input of amplifier 12. The positive voltage at the output V2 of amplifier 12 is also applied through resistor R3 to the inverting input of amplifier 14, and the output of amplifier 14 integrates downward in a slope 19 similar to positive slope 21 since an equal and opposite potential is applied at the inverting input of amplifier 14. At time T2, output V3 of amplifier 14 crosses the zero axis, and since the inverting input of amplifier 12 is now grounded, a negative output is applied to the non-inverting input of amplifier 12, which causes it to change state and latch in the opposite direction, producing a negative change in voltage between plus $Va$ and minus $Vb$. Current now flows through resistor R2 and through the now forward biased diode 20, providing a negative voltage at the base of transistor 18 sufficient to cut transistor 18 off. Control voltage V1 is thus reapplied through resistor R1 to the inverting input of amplifier 12, and the cycle described above is repeated.

As shown, the output V2 of amplifier 12 is a square wave, whereas the output of amplifier 14 is a triangular waveform of the same frequency.

Figure 3:
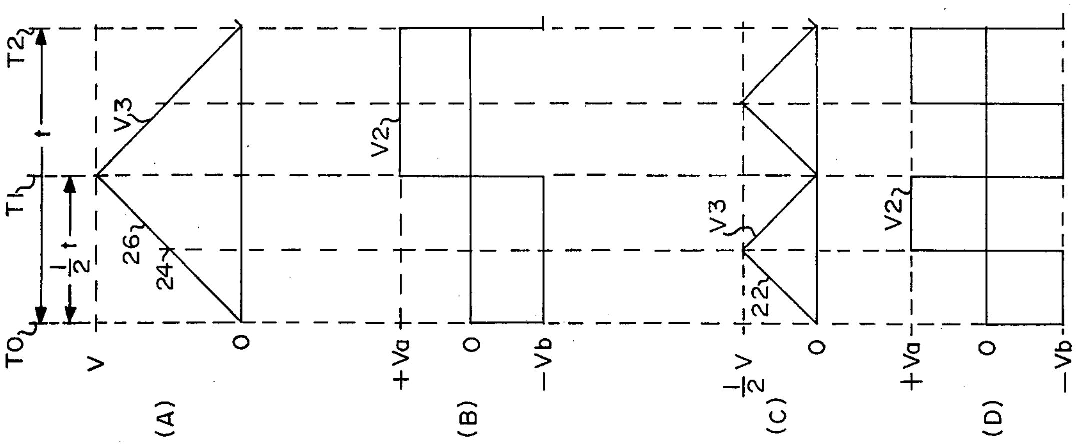
FIGS. 2 and 3 contain a series of waveforms illustrative of the function and operation of the invention.

The relationship between input voltage V1 and the output frequency of voltage controlled oscillator 10 is illustrated in FIG. 3.

For purposes of illustration, it is assumed that at time T0 the applied input voltage V1 is adjusted to voltage level V (FIG. 3). This results in a negative change to $-Vb$ at output V2 of amplifier 12 (waveform B) which is coupled through resistor R3 to the inverting input of amplifier 14. Integrator 15 then integrates upward from zero volts until at T1 the output first exceeds input voltage V. This causes amplifier 12 to switch, which in turn results in a positive change at output V2 to +Va a volts (waveform B). Next, integrator 15 integrates downward, and the output crosses the zero axis at T2 to complete one cycle during time interval $t$. If the input voltage V1 is now reduced to ½V, then the period of each cycle is reduced to ½$t$, as illustrated by waveforms C and D.

It is readily seen (FIG. 1) that square wave signal V2 at the output of amplifier 12, which is coupled through R3 to the inverting input of integrator 15, is either a constant +V$a$ or −V$b$. Therefore, the slope of each triangular waveform V3 is constant and independent of the value of input voltage V1. As a result, when V1 is reduced to ½V and applied to amplifier 12, the initial slope 22 of V3 (waveform C) exceeds the value of V1 at a midpoint 24 of positive slope 26 of V3 as shown in waveform A. Integrator 15 then integrates downward to complete one output cycle at time T1, or during an interval of ½$t$.

From the above, it is seen that the period of oscillation "$t$" is directly proportional to the input voltage V1, and since one divided by the frequency is equal to the period of oscillations, the input voltage V1 must be proportional to $$\frac{1}{\text{frequency}}.$$

A formula for the choice of component values for a given frequency range is, of course, needed. To begin with, resistors R1 and R2 do not enter into the frequency calculations. Resistor R1 is selected for a very low voltage drop when transistor 18 is off. Resistor R2 is selected to supply the proper current to the base of transistor 18 to minimize the emitter to collector voltage drop at the time when transistor 18 is in saturation. The first step is to describe V3, the output of integrator 15. It is known that V2 is either at a positive voltage Va or negative voltage Vb and that the state of V2 changes only when the integrator output voltage is crossing zero volts or the input voltage V1. The output of integrator 15 may be described by this equation:

$$V3=VO+\frac{it}{C} \quad (1)$$

where $VO$ is the initial voltage, $i$ is the current in integrating capacitor $C$, $t$ is time, and $C$ is also the capacity of integrating capacitor $C$. Since amplifier 14 may be deemed a summing amplifier, i1 in the capacitor is the negative of the current in resistor R3 or $$i1=\frac{-V2}{R3} \quad (2)$$

Using this in equation 1 yields $$V3=VO-\frac{-Vbt1}{R3C} \quad (3)$$

Consider first the conditions where $V3$ is zero at $t1=0$ and $V2=Vb$. The output becomes $$V3=\frac{-Vbt1}{R3C}$$

or solving for time yields $$t1=-\frac{R3CV1}{Vb} \quad (4)$$

Next consider the condition for $V2=Va$ and $VO=V1$. Equation 3 takes the form $$V3=V1-\left(\frac{+Vat2}{R3C}\right)$$

Solve for $t2$ and let $V3=0$ to yield $$t2=+\frac{R3C(V1)}{Va} \quad (5)$$

The frequency is then given by $$f=\frac{1}{t1+t2}=-\frac{1}{R3CV1}\;\frac{VaVb}{Va-Vb} \quad (6)$$

In most cases, $Va=-Vb$ and equation 6 reduces to $$f=\frac{Va}{2R3CV1} \quad (7)$$

From the foregoing, it will be seen that the present invention provides a new type of voltage controlled oscillator which provides a convenient, economical and accurate means of converting a voltage to a frequency wherein the oscillator oscillates at a function of $$\frac{1}{\text{input voltage}}.$$

What is claimed is:

1. A voltage controlled oscillator comprising:

a first stage comprising:

a first operational amplifier and a clamping transistor, the output of said first operational amplifier being connected to the input of said transistor, and the output of said transistor being connected to the inverting input of said first operational amplifier;

a second stage comprising:

a second operational amplifier, integrating means, a timing resistor, said integrating means being connected between the output of said second operational amplifier and the inverting input of said second operational amplifier, said timing resistor being connected between the output of said first operational amplifier and the inverting input of said second operational amplifier, and the output of said second operational amplifier being connected to the non-inverting input of said first operational amplifier; and means for connecting a control voltage to the inverting input of said first operational amplifier.

2. A voltage controlled oscillator as set forth in claim 1 wherein said integrating means comprises a capacitor.

3. A voltage controlled oscillator as set forth in claim 1 wherein said means for supplying a control voltage input to said operational amplifier comprises a positive voltage source, the collector of said transistor is connected to said inverting input of said first operational amplifier and said first stage further includes a diode connected in reverse polarity across the base-emitter circuit of said transistor.

4. A voltage controlled oscillator as set forth in claim 2 further comprising current limiting resistance connected between the output of said first operational amplifier and the input of said transistor.

* * * * *

UNITED STATES PATENT AND TRADEMARK OFFICE

CERTIFICATE OF CORRECTION

PATENT NO. : 3,914,712

DATED : Oct. 21, 1975

INVENTOR(S) : James R. Currie

It is certified that error appears in the above-identified patent and that said Letters Patent are hereby corrected as shown below:

On the cover sheet of the patent, delete the following:

" 73 ASSIGNEE: The United States of America as represented by the United States National Aeronautics and Space Administration Office of General Counsel - Code GP, Washington D.C. "

Signed and Sealed this

Eighth Day of February 1977

[SEAL]

*Attest:*

RUTH C. MASON
*Attesting Officer*

C. MARSHALL DANN
*Commissioner of Patents and Trademarks*